United States Patent [19]

Rouy

[11] Patent Number: 5,457,651
[45] Date of Patent: Oct. 10, 1995

[54] METHOD AND ARCHITECTURE FOR ACCELERATED PROGRAMMING OF UNIFORM DATA INTO AN ELECTRICALLY PROGRAMMABLE MEMORY

[75] Inventor: Olivier Rouy, Aix-En-Provence, France

[73] Assignee: SGS Thomson Microelectronics, S.A., Gentilly, France

[21] Appl. No.: 177,116

[22] Filed: Jan. 3, 1994

[30] Foreign Application Priority Data

Dec. 31, 1992 [FR] France .................................. 92 15993

[51] Int. Cl.⁶ .................................................. G11C 16/02
[52] U.S. Cl. ........................... 365/185.04; 365/189.01; 365/230.01
[58] Field of Search ............................. 365/185, 189.01, 365/201, 230.01, 233; 371/21.1, 21.2

[56] References Cited

FOREIGN PATENT DOCUMENTS 2215155  9/1989  United Kingdom .

OTHER PUBLICATIONS

Patent Abstracts of Japan, vol. 16, No. 551 (P-1453) 20 Nov. 1992 & JP-A-42 06 094 (Mitsubishi Electric Corp.) 28 Jul. 1992.

Primary Examiner—David C. Nelms
Assistant Examiner—F. Niranjan
Attorney, Agent, or Firm—Robert Groover; Betty Formby

[57] ABSTRACT

A method for the programming of a data element in an electrically programmable memory in integrated circuit form comprising a data input/output bus, an address bus, a register for the control of instruction sequencing modes and an enable signal (/OE), said signal enabling the data output bus in an active state. When the control register receives a uniform programming instruction, it sends a uniform programming sequencing mode signal so that an inactive state of the enable signal triggers the programming of the data element at a memory address present in the address bus and so that the active state of the enable signal triggers the stopping of the programming operation. Also disclosed is an electrically programmable memory in integrated circuit form, implementing a method such as this. The disclosure can be applied to electrically programmable memories.

40 Claims, 3 Drawing Sheets

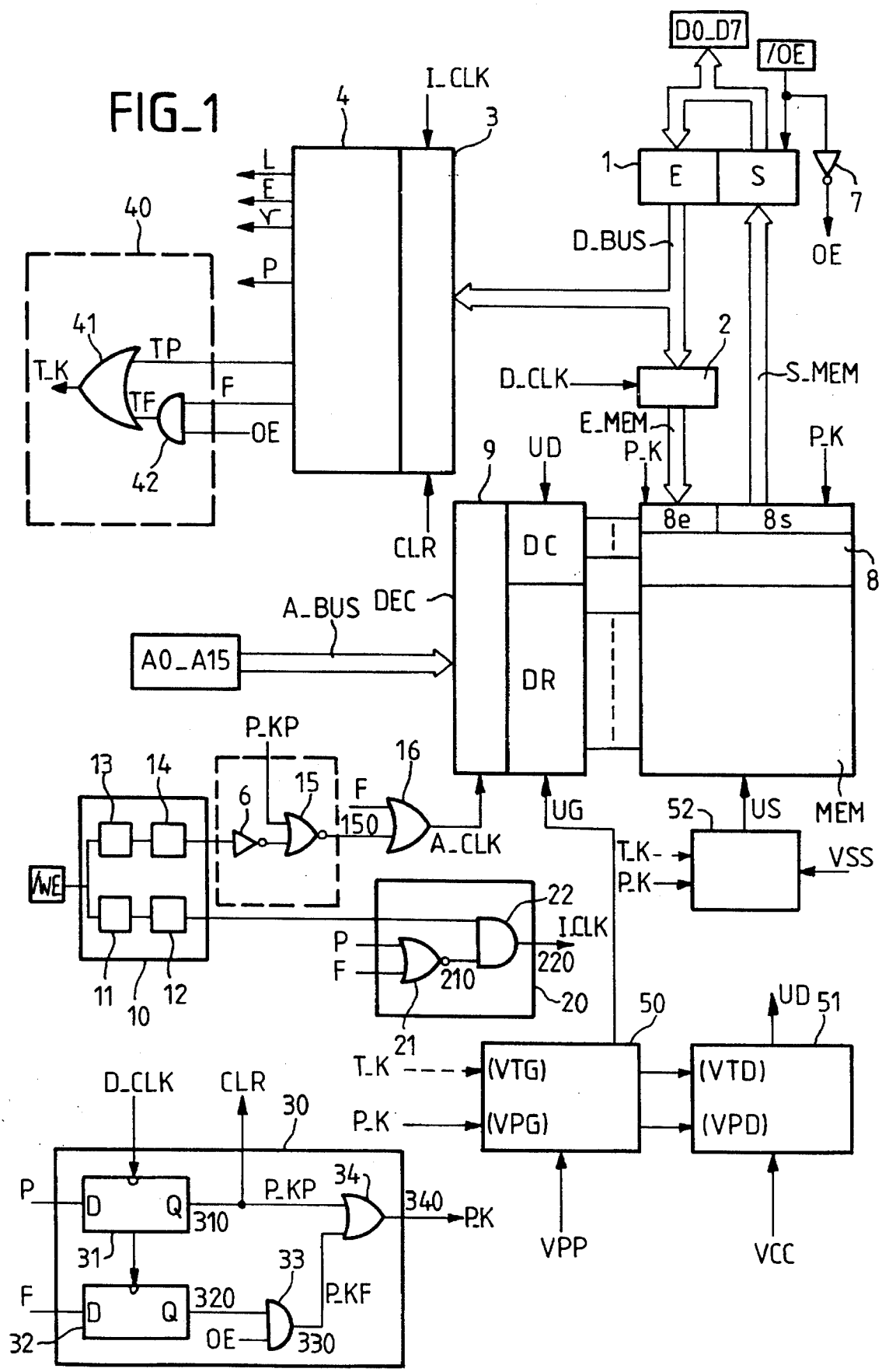

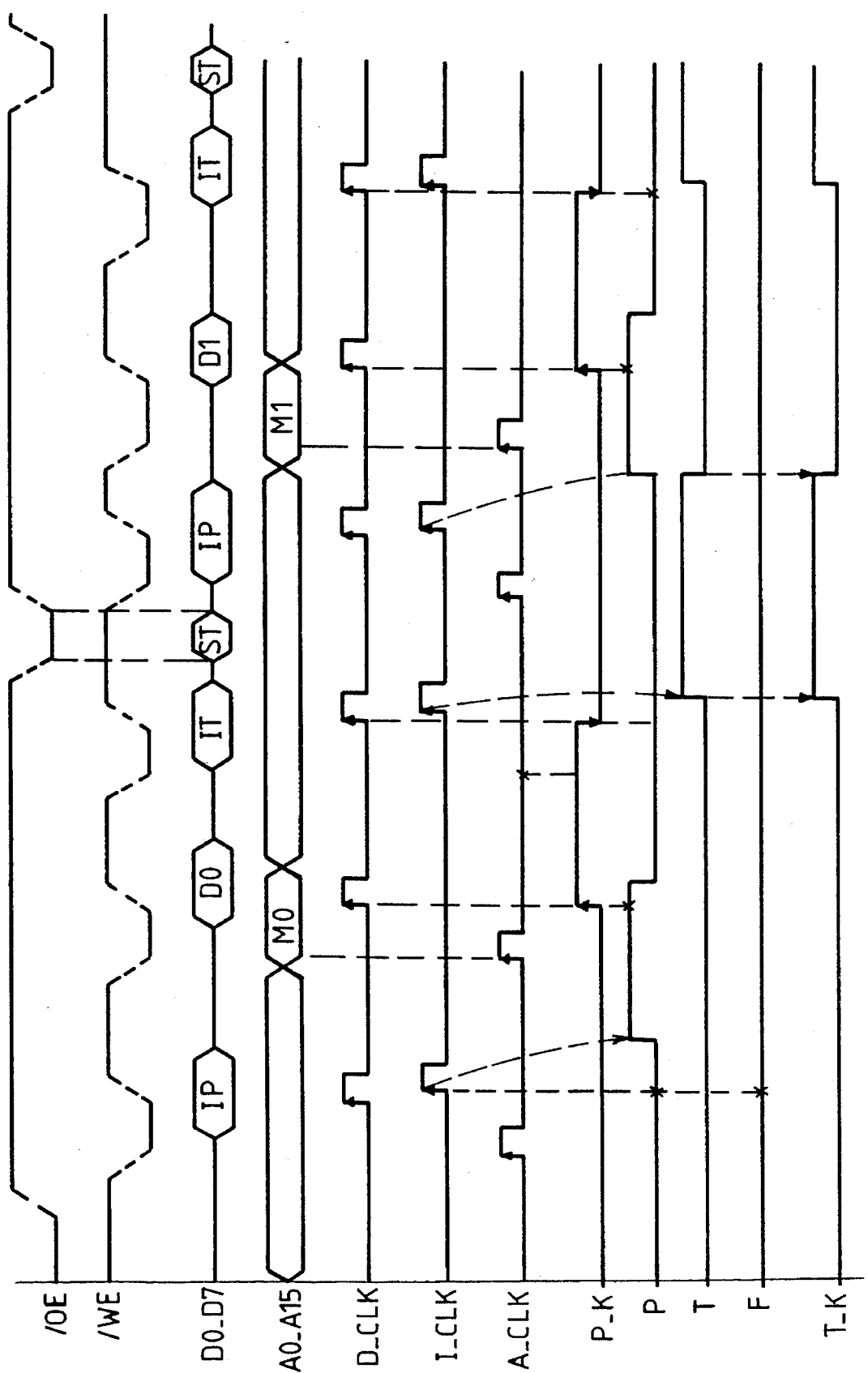

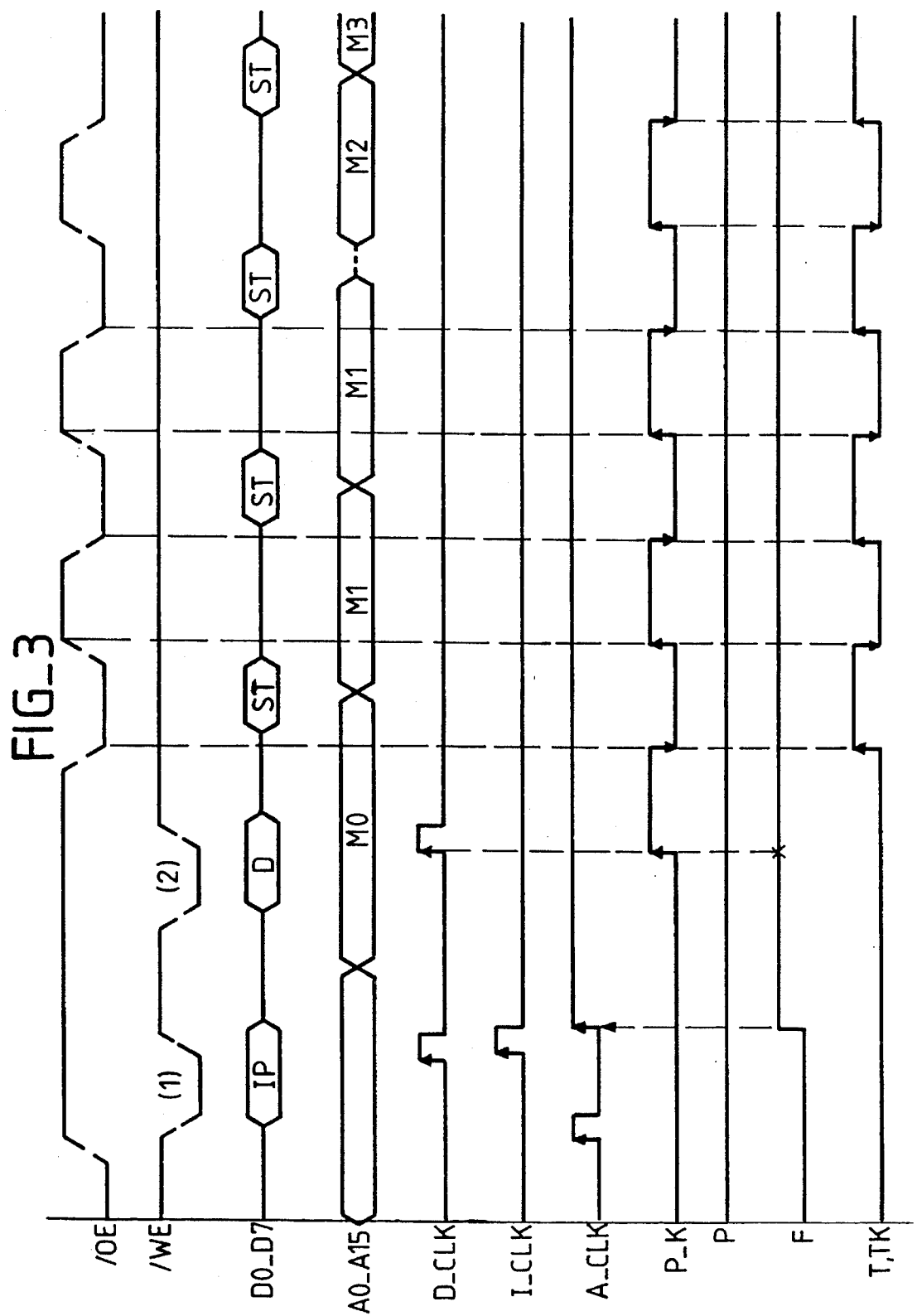

METHOD AND ARCHITECTURE FOR ACCELERATED PROGRAMMING OF UNIFORM DATA INTO AN ELECTRICALLY PROGRAMMABLE MEMORY

CROSS-REFERENCE TO RELATED APPLICATION

This application claims priority from French Application 92-15993, filed Dec. 31, 1992, which is hereby incorporated by reference.

BACKGROUND AND SUMMARY OF THE INVENTION

The present invention relates to a method for the programming an electrically programmable memory with a uniform field of data (e.g. all "1" values), and to memory architectures implementing such methods, especially to memories comprising a dynamic control interface, and most especially to flash EPROM type memories.

Memories with dynamic control interfaces have the necessary internal circuitry to carry out the internal sequencing of certain operations on the memory such as, for example, the programming operation. Flash EPROM memories typically include such circuitry.

It may be recalled that a flash EPROM memory is constituted by floating-gate memory cells having a gate oxide with a thickness that is small and uniform above the conduction channel. The cells are programmed by means of hot electrons. The total erasure of the memory is achieved by tunnel effect.

These different operations use different voltage levels at the gates, sources and drains and particular periods of application of these levels. Each operation may be followed by a checking operation that consists of a reading of the programmed or erased cells, with reading voltage levels that are higher than in standard reading, to give the programming and erasing operations a high degree of reliability.

It is to simplify the use of memories such as these that an architecture with a control register has been proposed.

Flash EPROM type memories thus include a control register to receive instruction codes and circuitry to sequence the corresponding tasks. Generally, the external signals used are a write enable signal /WE, a signal to enable the output of the data elements in reading mode /OE, data signals such as for example D0–D7, address signals such as for example A0–A15, and connections for supply voltage VCC, high voltage VPP, and ground VSS. (By convention, the signals /OE and /WE are active in the low state.)

The first cycle awaited by the memory circuit is a cycle for the writing of an instruction code. This is done with the signal /OE in the inactive state (to inhibit the output of data elements on the signals D0–D7), while activating the write enable signal /WE and presenting, on the external data signals D0–D7, an instruction code that is memorized in the control register.

In the case of an instruction for the programming of a data element at a memory address, the next cycle awaited by the circuit is a cycle for writing the data element and the address. The programming is then triggered.

The memory circuit then awaits a new cycle for the writing of the instruction code for the verification of the programming. The effect of this writing operation is to stop the programming. The signal /OE is at the active level to enable the output, on the data signals D0–D7, of data that indicates whether or not the programming operation has been successful.

The duration of the programming is determined by the relative timing of the second cycle (for the writing of the data element to be programmed) which triggers the start of the programming operation, and the third cycle (for the writing of the verification instruction code) which triggers the stopping of the programming operation.

In the case of an erasure instruction, the control sequence is similar but simpler, because the erasure relates to the entire memory array (or to a sector when the array is segmented) and not to particular word addresses.

However, the erasure of the memory array requires all the memory array to be previously programmed so as to ensure a uniform and reliable erasure of the memory. If the erasure consists, by convention, in placing the memory cells in the logic state "1" and the programming, in placing the memory cells in the logic state "0", the entire memory has to be programmed in a uniform field of zero ("0") before the erasure is performed.

The total time of the programming control sequences for the entire memory array then becomes especially great since, as has been seen, it calls for three writing cycles for each memory address. For large-capacity memories, this time needed for the programming in a uniform field entails particularly heavy penalties for the user.

The manufacturer also suffers. Not only are the erasure test procedures slow, but also, more generally, testing and fault detection is made more difficult. The operations used for testing often include operations of programming a uniform field with complementary logic states for two adjacent cells in a word (known as the checkerboard test). (For example, such a test may require programming each memory byte with the data element $55_H$, i.e. binary 01010101.) Thus, the costs of the tests are very high.

Innovative Programming Method

The disclosed inventions resolve this problem with another method for programming a uniform field that makes it possible to reduce the number of writing cycles that are needed. According to the disclosed inventions, the data element to be programmed is written only once, for the programming of the first address, and is memorized to program the following addresses.

Another innovative idea is that the writing of the instruction code for programming a uniform field should be done only once. The duration of the programming and the taking into account of the successive addresses are sequenced solely by means of the enable signal /OE. Thus, only two writing cycles /WE are required at the start of the sequence, and thereafter only the enable signal /OE and the address signals A0–A15 have to be managed.

The disclosed innovations provide a method for the programming of a data element in an electrically programmable memory in integrated circuit form comprising a data input/output bus, an address bus, a register for the control of instruction sequencing modes and an enable signal (/OE), said signal enabling the data output bus in an active state.

According to the invention, when the control register receives a uniform programming instruction, it sends a uniform programming sequencing mode signal so that an inactive state of the enable signal triggers the programming of the data element at a memory address present on the address bus and so that the active state of the enable signal triggers the stopping of the programming operation.

The invention also relates to an electrically programmable memory in integrated circuit form comprising an address bus, a data input/output bus and an instruction sequencing mode control register and receiving an enable signal /OE, this signal enabling the data output bus in an active state and a write enable signal /WE to generate a data memorization clock signal in a data register, an address memorizing clock signal in a decoder of the memory and a clock signal I_CLK for the memorizing of instructions in the control register. According to the invention, the memory comprises means to deliver a uniform programming control signal receiving, at input, a programming mode signal, the data memorizing clock signal and the enable signal /OE and delivering, at output, an active level of the uniform programming control signal during an inactive level of the enable signal /OE and an inactive level of the uniform programming control signal during an active level of the enable signal, the uniform programming mode signal being delivered by the control register.

BRIEF DESCRIPTION OF THE DRAWING

The present invention will be described with reference to the accompanying drawings, which show important sample embodiments of the invention and which are incorporated in the specification hereof by reference, wherein:

FIG. 1 is a block diagram of a flash EPROM memory enabling the implementation of the uniform programming method according to the invention;

FIG. 2 is a timing diagram of a standard programming sequence of the memory of FIG. 1;

FIG. 3 is a timing diagram of a uniform programming sequence according to the invention.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

FIG. 1 shows a memory circuit with an architecture that can be used to implement the method of the invention. This example corresponds to a memory circuit comprising an electrically programmable and electrically erasable flash EPROM type of memory array MEM. It may be useful to recall certain points. A memory array is organized in rows and columns. All the cells of one and the same row have the same gate. All the cells of one and the same column have the same drain. The sources of the cells are joined together to a common node of the circuit. The access to a cell is obtained by applying a voltage UG to the row connected to the gate of this cell, a voltage UD to the column connected to the drain of this cell, and a voltage US to the common node of the sources.

The reading of a flash EPROM cell is thus obtained by the application of a gate voltage UG of the order of 5 volts (VCC) to the row, a drain voltage UD of the order of 1 volt to the column and a voltage US equal to zero volts (VSS) to the common node of the sources of the memory array. The contents of the cell are read at the column.

The programming of a flash EPROM cell is obtained by the application of a gate voltage UG equal to about 12 volts (VPP) to the row, a drain voltage UD of the order of 6 volts to the column and a voltage US equal to zero volts (VSS) to the common node of the sources of the memory array.

The erasure is obtained by the application of a gate voltage UG equal to the ground VSS, the column being unconnected, and a source voltage US equal to about 9 volts.

A verification reading operation is preferably done after a writing and programming operation. This reading is advantageously done at a gate voltage UG that is higher than in normal reading, of the order of seven volts.

The well known circuits used for the generation of reading and erasing commands, which are not part of the present description, will not be described in detail. Hereinafter, reference will be made more particularly to the uniform programming method according to the invention, and to the possibility of post-programming verification reading.

A memory circuit receives mainly the following external signals:

- the data input/output signals (D0–D7 in the example of FIG. 1);
- the address signals (A0–A15 in the example);
- the output enable signal /OE (for the enabling of the output bus S_MEM and the reading of data elements of the memory onto the external input/output signals D0–D7), which is active in the low state (logic "0"); and
- the write enable signal /WE, which is active in the low state. A negative (zero-going) pulse of this signal enables the generation of clock signals for the memorization of the data elements, addresses and instructions. Hereinafter, the expression "writing cycle" corresponds to the generation of an active (i.e. negative) pulse on the signal /WE.

Firstly, the external input/output signals D0–D7 can reach an input E of a register 1 to form the internal data input bus of the circuit referenced D_BUS. Secondly, the register 1 receives the data output bus S_MEM of the memory array MEM to deliver, at external output S of the register, a data element read in the memory. This output S is connected to the outputs D0–D7. The register 1 is under the control of the output enable signal /OE. This output enable signal /OE permits, in the active state (/OE=0), the transmission from the output bus S_MEM of the memory to the output S of the register 1. In the inactive state (/OE=1), the output S is placed in a floating state: it does not dictate any logic states on the external signals D0–D7, and hence the externally defined value of the input E is transmitted on the internal data input bus D_BUS.

The data input bus D_BUS is connected to the input of a data memorizing register 2 that has its output, referenced E_MEM, connected to the programming input circuit 8e associated with the circuit 8 of control gates for the bit lines or columns of the memory array MEM. The data memorizing register 2 receives a clock signal D_CLK which, upon a pulse, prompts the memorizing of a data element present at the data bus D_BUS. The input circuit 8e comprises notably, in a known way, writing amplifiers (not shown).

The control gates circuit 8 is furthermore associated with an output circuit 8s that comprises read amplifiers and output registers and delivers the output S_MEM of the memory array.

The address signals A0–A15 are transmitted internally on the address bus A_BUS connected to the address decoder DEC of the memory array. This decoder has, in a standard way, a row address (or word line) decoder DR, a column address (or bit line) decoder DC and an address memorizing register 9.

This register 9 receives, at input, the address bus A_BUS and a clock signal A_CLK. A pulse of this signal prompts the memorizing of the address present at the address bus in the register 9 and the decoding of this address by the decoders DR and DC.

The decoder DR receives, at input, a gate voltage control signal UG which it applies to the row designated by the decoded address, the other rows being kept, for example, at the ground VSS.

The decoder DC receives, at input, a drain voltage control signal UD which it applies to the columns designated by the decoded address, the other columns being, for example, unconnected. It may be recalled that the address of a word of the memory array designates a single row and one or more columns. The number of columns designated corresponds to the number of data bits of a memory word. In the example where each data element is eight bits (i.e. a byte-wide memory), an address of a memory word designates one row and eight columns, each column being associated with one bit location, having a determined significance, of the data word. For the programming of a memory word with a data element, the programming voltage will be applied only to the columns for which the value of the corresponding bit in the data element to be programmed takes the so-called programming value. In one example, if the programmed state of a cell is the logic state 1, if the data element to be programmed is equal to 55 H (hexadecimal), then only the columns associated with the bit positions 0, 2, 4 and 6 will have the programming voltage applied to them.

The decoder DC therefore does not apply the drain voltage UD directly to the columns. It applies it through the data programming circuit 8e and the gates circuit 8 for the control of the columns. The data programming circuit 8e is selected during the programming of an address of the memory with a data element D stored in the data register 2. It receives this data element on the output bus E_MEM of the output register 2. The gates circuit 8 is triggered in programming mode by the decoder DC to select the address columns and by the data programming circuit 8e to program only the columns designated by the data element D.

When the system is out of the programming mode, it is the output circuit 8s that is selected by default, the input circuit 8e being then deselected.

The working of a memory such as this is controlled by a control register 3 and by task sequencing circuits. The control register 3 receives, at input, the data bus D_BUS, a clock signal I_CLK and a zero-setting signal CLR. It includes a decoder 4 that delivers an active level (=1) at the operating mode output associated with the instruction memorized in the control register, upon a clock pulse I_CLK. The active level of the zero-setting signal CLR is, in the example, at 1 and this active level resets all the outputs of the control register at zero. In the example, 5 control outputs are provided:

one reading mode output L, corresponding to an instruction code one erasure mode output E, corresponding to an instruction code IE;

one post-erasure verification mode output V corresponding to an instruction code IV;

one normal programming mode output P, corresponding to an instruction code IP;

one post-programming verification mode output TP corresponding to an instruction code IT; and one output F of a fast uniform programming mode corresponding to an instruction code IF, which is planned according to the invention.

The reading, erasure and post-erasure verification modes are indicated only as a reminder. Hereinafter, the emphasis will be on the normal or uniform programming modes according to the invention.

A first control circuit 50 for the gate voltage UG receives, at input, firstly the programming control signal P_K and, in the example shown, the programming verification control signal T_K. It switches over, to its output UG, the voltage corresponding to the active control level at input, this being a voltage that it generates from external voltages.

In the example of the flash EPROM, wherein the programming gate voltage VPG has a value of 12 volts and the programming verification gate voltage VTG has a value of 7 volts, the external voltage used by the circuit 50 to generate the voltages VPG and VTG is the high voltage VPP (12 volts). The voltage generation circuits, which are well known, will not be described in detail.

A second control circuit 51 for the drain voltage UD receives the same control signals at input. It generates the corresponding programming drain voltage VPD (5 volts in the example) and programming verification drain voltage VTD (1 volt in the example) from the supply voltage VCC (5 volts) of the circuit and switches over, to its output UD, the voltage associated with the active control level at input.

Finally, a third circuit 52 for the control of the source voltage US of the memory array receives, at input, the same control signals P_K and T_K and, in the represented example of a flash EPROM memory, the ground voltage VSS of the circuit. It is this voltage VSS that is switched over to the output US in both cases (programming or programming verification).

The internal circuitry must generate clock signals to ensure the different sequencing operations. These signals (generated by familiar techniques) are:

a clock pulse signal D_CLK to memorize the data elements in the register 2 of data elements associated with the memory. A pulse D_CLK is generated on each rising edge of the write enable signal /WE. At each pulse of this clock signal D_CLK, the data elements present at the data bus D_BUS are memorized in the data register 2;

a clock pulse signal A_CLK to memorize the addresses in the decoder DEC. A pulse A_CLK is generated on each falling edge of the write enable signal /WE. At each pulse of this clock signal A_CLK, the address present at the address bus A_BUS is memorized in the address decoder DEC of the memory.

a clock pulse signal I_CLK to memorize the instructions. At each pulse of this clock signal I_CLK, the data element (which is an instruction code) present at the data bus D_BUS is memorized in the control register. A pulse I_CLK is generated on each pulse of the clock signal D_CLK if the programming mode P is not activated or if the uniform programming mode F according to the invention is not activated. Indeed, an instruction command for normal or uniform programming according to the invention is necessarily followed by a cycle for the writing of the data element to be programmed. It is therefore not necessary for this data element to be memorized in the control register.

To generate these different clock signals, the write enable signal /WE is applied to the input of a circuit 10 for the generation of the clock signals A_CLK and D_CLK. This circuit 10 comprises, in a known way:

a circuit 11 for the detection of the rising edge of the signal /WE in series with a first monostable circuit 12 to deliver the clock signal D_CLK.

a circuit 13 for the detection of the descending edge of the signal /WE in series with a second monostable circuit 14. This monostable circuit 14 delivers an output connected to the input of an inverter 6 in series with an input of a NOR gate 15 which receives, as another input, the normal programming control signal P_KP.

According to the invention, the output 150 of this NOR gate 15 is connected to an input of an OR gate 16. The other input of this gate 16 receives the signal for the uniform field programming mode F. The output of the OR gate 16 delivers the clock signal A_CLK.

This gate 16 enables the clock signal A_CLK to be forced to the upper level (A_CLK=1) when the uniform field programming mode is activated (F=1). The address present in the decoder of the memory is then the address present at the same time on the address bus A_BUS.

The clock signal I_CLK is normally a copy of the data memorizing clock signal D_CLK, except in programming mode (normal or uniform) when it has to be inhibited. A circuit 20 for the generation of the clock signal I_CLK thus comprises a NOR gate 21 which receives, at input, the normal programming mode signal P and uniform programming mode signal F and which has its output 210 connected to an input of an AND gate 22. This gate 22 receives the clock signal D_CLK at another input. At output 220, the gate 22 delivers the clock signal I_CLK. This logic circuit 20 makes it possible, in normal programming mode (P=1) or uniform programming mode according to the invention (F=1) to prevent the copying of the pulses D_CLK on the clock signal I_CLK. A circuit 30 for the generation of the programming control signal P_K comprises, in a known way, a first flip-flop circuit 31 which receives, at input, the normal programming mode signal P, and the data memorizing clock signal D_CLK. At its output 310, it delivers the zero-setting signal CLR for the control register 3 and the normal programming control signal P_KP.

According to the invention, the circuit 30 for the generation of programming control signals comprises a second flip-flop circuit 32. This flip-flop circuit receives, at input, the uniform programming mode signal F and the clock signal D_CLK. Its output 320 is connected to an input of an AND gate 33, the other input of which receives the output enable signal /OE. This AND gate 33 delivers, at its output 330, the uniform programming control signal P_KF.

The output 310 of the first flip-flop circuit 31 and the output 330 of the AND gate 33 are connected to the input of an OR gate 34, the output 340 of which delivers the control signal P_K for the programming of the memory.

A circuit 40 for the generation of the post-programming verification control signal T_K comprises an OR gate 41 receiving, at input, the normal programming verification mode signal TP and the uniform programming verification mode signal TF. At output, it delivers the programming verification control signal T_K which triggers the application of the verification reading gate and drain voltages VTG and VTD which are respectively of the order of 7 volts and 1 volt for a flash EPROM memory. (Should the verification be done for normal reading voltages, the gate voltage UG is five volts).

The uniform programming verification mode signal TF is delivered by the output of an AND gate 42 which receives, at input, the uniform programming mode signal F delivered by the control register 3 and the inverted enable signal OE. In this case, the programming command signal T_K is therefore active during the active level of the enable signal /OE, this being a level that enables the output S_MEM on the data signals D0–D7 of the particular data element ST read in the memory.

In the event of the activation of the normal programming verification mode signal TP, the programming control signal T_K is the copy of the mode signal TP. In general then, there is a wait of some microseconds to activate the enable signal /OE at output, this being the time in which the reading is done.

Operation

A description will now be given of the working of a memory such as this.

Normal Programming

The timing diagram of the normal programming sequence is shown in FIG. 2. The control register 3 receives the normal programming instruction code IP in a first writing cycle (negative pulse on the signal /WE), the enable signal being at the inactive level (/OE=1), which inhibits the data output. (This first writing cycle is indicated as "(1)" in FIG. 2.) The control register 3 activates the mode signal P at 1. In a second writing cycle (2), a data element D0 is memorized in the data register 2, and an address M0 is memorized in the register 9 of the decoder. (This second writing cycle is indicated as "(2)" in FIG. 2.) The clock signal I_CLK is inactive (due to circuit 20, because P is now high). The flip-flop circuit 31 then delivers an active level equal to 1 at its output. This active level activates, firstly, the start of the programming: the signals P_KP and P_K go to 1, which activates the application of the programming voltages to the memory address M0. Secondly, this active level activates the zero-setting CLR of the control register 3: the mode signal P returns to zero. A third writing cycle (3) generates a new pulse D_CLK. (This third writing cycle is indicated as "(3)" in FIG. 2.) However, the pulse A_CLK is inhibited (gates 6, 15) because the normal programming command signal P_KP is active. This makes it possible to maintain the address programmed in the decoder. Since the mode signal P is at 0, the flip-flop circuit 31 delivers a level 0 at output and hence the programming control signal P_K goes back to zero: the programming of the address M0 with the data element D0 is ended. A sequence for the programming of an address thus comprises three writing cycles (1), (2) and (3). The duration of the programming is controlled by the last two writing cycles.

Advantageously there is provision, after each normal programming of a memory address, for verifying this programming operation. The instruction IT for the verification of the normal programming is thus written in the control register 3 during the third writing cycle (3). This third cycle indeed generates a pulse I_CLK since, at the second writing cycle, the mode P signal has been reset at zero (circuits 20 and 30). The programming verification mode is then activated T=TP=1, and a verification command signal T_K is activated by the copying of the mode signal TP. This command signal pertains to a reading of the memory address that has just been programmed and that is still present during the third cycle of writing (3) in the register 9 of the decoder, the pulse A_CLK being inhibited at the third writing cycle by the gate 15. Upon activation of the enable signal /OE (/OE=0), the data element read ST exits at the output S_MEM of the memory and on the external data signals D0–D7. There is generally a wait of some microseconds between the activation of the command signal T_K and the activation of the enable signal /OE, which is the time during which the reading is done (the voltage switch-over time etc.).

Uniform Programming

The timing diagram of the uniform programming sequence is shown in FIG. 3. The control register 3 receives the uniform programming instruction code IF in a first writing cycle "(1')", the enable signal being at the inactive level (/OE=1). The control register 3 activates the mode signal F (F=1). This mode signal F then forces the clock signal A_CLK to the high level. This makes the address bus transparent for the decoder DEC of the memory. The clock signal I_CLK is itself forced to the inactive low level. In a second writing cycle, a data element D is memorized in the data register 2 and an address M0 presented and kept in the address bus A_BUS is decoded by the decoder DEC. The flip-flop circuit 32 delivers an active level at output. Since the enable signal /OE is at 1 (inactive level), the output of the gate 33 triggers a high level on the programming control signal P_K, which triggers the application of the programming voltages to the address M0. The passing of the enable signal /OE to the active low level then causes the passing to zero of the control signal P_K (gate 33): the programming is stopped. A new address M1 may be positioned and kept in the address bus. The passing of the enable signal /OE to the inactive level will trigger the programming of this address M1 with the data element D which is still memorized in the data register 2. In short, the uniform programming sequence comprises two writing cycles: a first writing cycle to activate the mode (F) and a second one to memorize the data element to be programmed and to position the first address. Then, it is the enable signal /OE that triggers the programming of the addresses presented during its active level (/OE=1). It is observed that the new address to be programmed must be established before the enable signal /OE is inactive, i.e. before the programming of this new address starts. It should therefore be positioned during the active level of the enable signal /OE. However, in the event of programming verification, it must be positioned after the reading for the verification of the previous programming. The change in address is therefore done while the enable signal /OE is active (/OE=0) and slightly before it becomes inactive (/OE=1). The time for the establishing of the data elements and addresses is straightforward, and will not be described in detail.

In the event of uniform programming, it can be seen that the programming time is controlled by the duration between two active pulses of the enable signal /OE. The described sequences of normal programming and programming a uniform field with post-programming verification correspond to the preferred example of programming by successive approximations. In this case, the programming time is relatively short (about ten microseconds), and it is possible to reprogram the same address several times if the data element ST read after programming is not sufficient. This well known method of programming makes it possible to approach a determined conduction voltage threshold of the programmed cells with the greatest possible efficiency. Thus an increase is obtained in the reliability (the cells undergo less stress) and speed of the programming.

However, it is possible to use a mode of programming with a period of time that is deliberately lengthy, determined according to the technology of the memory, at the end of which it is certain that the memory cells are programmed. In this case, it is possible that the user may not carry out a verification. Then in the sequence of programming a uniform field according to the invention notably, there will be no reading of the programmed address. The logic circuits associated with this verification mode, referenced 40, 41, 42 and 15 and shown in dashes in the architecture of the memory in FIG. 1, will not be used. However, the uniform programming method using the enable signal /OE to trigger and stop the programming is applied in the same way.

In the method according to the invention, the programming a uniform field is initialized in a first writing cycle. In a second writing cycle, the programming is started with a first address presented and kept in the address bus with the data element to be programmed, memorized in the data register 2 associated with the memory. Then, use is made solely of the enable signal /OE and the address signals to stop the programming and present a new address during the active level (/OE=0) and program this address on the inactive level (/OE=1).

Advantageously, in the event of verification of programming, the address programmed during an inactive edge (/OE=1) is read for verification during the active edge following the enable signal /OE (/OE–0).

The method of the invention enables the elimination of the writing cycles for the instruction codes, except the first one, and the writing cycles for the data element to be programmed, except the first one, when one and the same data element has to be programmed at several addresses. The result thereof is a particularly substantial gain in time, notably for the operations for programming a large part of the memory.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A method for operating a nonvolatile memory which includes a dynamic control interface, comprising the steps of:

(a.) when programmation of random or unknown data is desired, providing a normal-write instruction to said dynamic control interface, and thereafter providing an address and a data value to said memory, said dynamic control interface thereupon writing said data value at said address;

(b.) when programmation of uniform data is desired, in a uniform write mode, providing a uniform-write instruction to said dynamic control interface, and thereafter providing an address and a first data value to said memory, and activating an enable signal, said memory thereupon writing said first data value at said address; and thereafter repeatedly activating said enable signal while providing a stream of addresses to said memory without again providing said first data value to said memory, said dynamic control interface thereupon writing said first data value at each one of said stream of addresses every time said enable signal is activated.

2. The method of claim 1, further comprising a verification operation performed at the end of each said step (a).

3. The method of claim 1, further comprising an additional operation which is performed, at the end of each said step (a), to terminate writing.

4. The method of claim 1, further comprising a verification operation performed at the end of each said step (b).

5. The method of claim 1, wherein said nonvolatile memory is a Flash EPROM memory.

6. A method for writing uniform data into a nonvolatile memory which includes a dynamic control interface, comprising the steps of:

(a.) providing a uniform-write instruction to said dynamic control interface; and thereafter (b.) providing a first address and a first data value to said memory, whereupon said dynamic control interface automatically initiates writing of said first data value into said first address; and thereafter (c.) providing a stream of address values to said memory without again providing said first data value to said memory, and repeatedly activating an enable signal, whereupon said dynamic control interface automatically initiates writing of said first data value into the address then received.

7. The method of claim 6, further comprising a verification operation performed at the end of each said step (a).

8. The method of claim 6, further comprising an additional operation which is performed, at the end of each said step (a), to terminate writing.

9. The method of claim 6, further comprising a verification operation performed at the end of each said step (b).

10. The method of claim 6, wherein said nonvolatile memory is a Flash EPROM memory.

11. A method for the programming of a data element in an electrically programmable integrated circuit memory which includes a data input/output bus, an address bus, a register for the control of instruction sequencing modes, and a connection for receiving an enable signal, said signal enabling the data output bus in an active state, comprising the steps of:

when said control register receives a uniform programming instruction, latching in a first data element, and sending a uniform programming sequencing mode signal from said control register so that thereafter when the enable signal goes into the inactive state, the enable signal triggers the programming of said first data element at a memory address present on the address bus, and when the enable signal goes into the active state, the enable signal triggers the stopping of the programming operation.

12. A programming method according to claim 11, wherein a first address to be programmed is written in the address bus and the data element is written in a data register to program this first address, the enable signal being in the inactive state, the passing of the enable signal to the active state stopping the programming of the first address.

13. A programming method according to claim 12, wherein a new address to be programmed is written in the address bus during the active level of the enable signal and programmed with the data element during the inactive state following the enable signal.

14. A programming method according to claim 12, wherein the address programmed during an inactive level is read during the inactive level following the enable signal.

15. A programming method according to claim 13, wherein the address programmed during an inactive level is read during the inactive level following the enable signal.

16. A programming method according to claim 15, wherein an address is written on the address bus during an active level of the enable signal, after a reading during this active level, of the address programmed during the preceding inactive level.

17. An electrically programmable memory in integrated circuit form comprising:

a memory array, and at least one address decoder connected thereto;

an address bus;

a data input/output bus; and an instruction sequencing mode control register
connected to receive an externally provided enable signal, and in response thereto to enable said data bus,
connected to receive an externally provided write enable signal, and in response thereto to generate a data memorization clock signal in a data register, an address memorizing clock signal in said address decoder, and a clock signal for the memorizing of instructions in the control register, wherein said memory further comprises circuitry, for delivering a uniform programming control signal, which is connected to receive, at an input thereof, a programming mode signal, the data memorizing clock signal and the enable signal, and which is configured and connected to deliver, at an output thereof, an active level of the uniform programming control signal during an active level of the enable signal /OE and an inactive level of the uniform programming control signal during an active level of the enable signal, the uniform programming mode signal being delivered by the control register.

18. A memory according to claim 17, further comprising circuitry, for imposing a permanent level on the address memorizing clock signal, which is controlled by the uniform programming mode signal.

19. A memory according to claim 17, comprising circuitry, for delivering a read control signal, which is connected to receive, at an input thereof, the uniform programming mode signal and the enable signal in delivering an active read control signal during the active level of the enable signal.

20. A memory according to claim 17, wherein said circuitry for delivering a uniform programming control signal comprises a flip-flop circuit receiving, at input, the uniform programming mode signal and the data memorizing clock signal and delivering an output connected to an input of the AND gate, the other input of the AND gate delivering the uniform programming control signal.

21. A memory according to claim 18, comprising circuitry, for delivering a read control signal, which is connected to receive, at an input thereof, the uniform programming mode signal and the enable signal in delivering an active read control signal during the active level of the enable signal.

22. A memory according to claim 18, wherein said circuitry for delivering a uniform programming control signal comprises a flip-flop circuit receiving, at input, the uniform programming mode signal and the data memorizing clock signal and delivering an output connected to an input of the AND gate, the other input of the AND gate delivering the uniform programming control signal.

23. A memory according to claim 19, wherein said circuitry for delivering a uniform programming control signal comprises a flip-flop circuit receiving, at input, the uniform programming mode signal and the data memorizing clock signal and delivering an output connected to an input of the AND gate, the other input of the AND gate delivering the uniform programming control signal.

24. The method of claim 1, wherein a first control signal, which is different from said enable signal, commands the memory to receive incoming instructions from a data bus.

25. The method of claim 1, wherein a first control signal, which is different from said enable signal, commands the memory to receive incoming instructions from a data bus, and thereafter also commands the memory to read a data value from said data bus and an address from an address bus.

26. The method of claim 1, wherein, during said uniform write mode, said dynamic control interface thereupon outputs the stored data value into the most recently received one of said stream of addresses every time said enable signal is inactivated.

27. The method of claim 1, wherein, during said uniform write mode, said stream of address values is continuous and uninterrupted.

28. The method of claim 1, wherein each said data value includes multiple bits.

29. The method of claim 6, wherein during said step (a.) a first control signal, which is different from said enable signal, commands the memory to receive incoming instructions from a data bus.

30. The method of claim 6, wherein a first control signal, which is different from said enable signal, commands the memory to receive incoming instructions from a data bus during said step (a.), and also commands the memory to read a data value from said data bus and an address from an address bus during said step (b.).

31. The method of claim 6, wherein a first control signal, which is different from said enable signal, commands the memory to receive incoming instructions from a data bus during said step (a.), and also commands the memory to read a data value from said data bus and an address from an address bus during said step (b.), and remains constant during said step (c.).

32. The method of claim 6, wherein, during said step (c.), said memory outputs the stored data value into the most recently received one of said stream of addresses every time said enable signal is inactivated.

33. The method of claim 6, wherein, during said step (c.), said stream of address values is continuous and uninterrupted.

34. The method of claim 6, wherein each said data value includes multiple bits.

35. The method of claim 11, wherein a first control signal, which is different from said enable signal, commands the memory to receive incoming instructions from a data bus.

36. The method of claim 11, wherein a first control signal, which is different from said enable signal, commands the memory to receive incoming instructions from a data bus, and thereafter also commands the memory to read a data value from said data bus and an address from an address bus.

37. The method of claim 11, wherein, after said control register receives a uniform programming instruction, said dynamic control interface thereupon outputs the stored data value from the most recently received one of said stream of addresses every time said enable signal is inactivated.

38. The method of claim 11, wherein, during said uniform write mode, said stream of address values is continuous and uninterrupted.

39. The method of claim 11, wherein each said data value includes multiple bits.

40. A Flash EPROM memory, comprising:

an array of nonvolatile memory cells;

a dynamic control interface, connected to control writing to said memory cells, and connected to configured to selectably operate in externally selectable modes which include a normal-write mode and a uniform-write mode;

means for writing an externally received data value, in said normal-write mode, to said memory cells at an externally received address; and means for repeatedly writing a stored data value, in said uniform-write mode, to said memory cells at respective externally received addresses.

* * * * *

UNITED STATES PATENT AND TRADEMARK OFFICE
CERTIFICATE OF CORRECTION

PATENT NO.  : 5,457,651
DATED       : October 10, 1995
INVENTOR(S) : Olivier Rouy It is certified that error appears in the above-indentified patent and that said Letters Patent is hereby corrected as shown below:

Column 14, line 34, delete "configured to"

Signed and Sealed this

Thirtieth Day of September, 1997

Attest:

BRUCE LEHMAN

*Attesting Officer*    *Commissioner of Patents and Trademarks*